(12) United States Patent
Kuo et al.

(10) Patent No.: US 11,301,740 B2
(45) Date of Patent: Apr. 12, 2022

(54) INTEGRATED CIRCUIT, WIRELESS COMMUNICATION CARD AND WIRING STRUCTURE OF IDENTIFICATION MARK

(71) Applicant: Au Optronics Corporation, Hsinchu (TW)

(72) Inventors: Shyh-Bin Kuo, Hsinchu (TW);
Hsiang-Chi Cheng, Hsinchu (TW);
Sin-Jie Wang, Hsinchu (TW);
Yi-Cheng Lai, Hsinchu (TW);
Chung-Hung Chen, Hsinchu (TW);
Shih-Hsing Hung, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/082,033

(22) Filed: Oct. 28, 2020

(65) Prior Publication Data
US 2021/0182643 A1 Jun. 17, 2021

Related U.S. Application Data

(60) Provisional application No. 62/947,190, filed on Dec. 12, 2019.

(30) Foreign Application Priority Data

Sep. 26, 2020 (TW) .................. 109133465

(51) Int. Cl.
*G06K 19/06* (2006.01)
*G06K 7/08* (2006.01)
(Continued)

(52) U.S. Cl.
CPC ..... *G06K 19/0772* (2013.01); *G06K 19/0701* (2013.01); *H05K 1/028* (2013.01);
(Continued)

(58) Field of Classification Search
CPC ........... G06K 19/0772; G06K 19/0701; G06K 19/0723; G06K 19/07749;
(Continued)

(56) References Cited

U.S. PATENT DOCUMENTS 7,284,704 B2* 10/2007 Lubow ............. G06K 19/06018
235/462.01
2006/0186204 A1* 8/2006 Lubow ............. G06K 19/07769
235/462.01
(Continued)

FOREIGN PATENT DOCUMENTS

CN 103703473 2/2017
JP 2006153126 6/2006

OTHER PUBLICATIONS

Baidu Tieba, "The Logo of HTC One is actually a capacitive button," with partial English translation thereof, pp. 1-4, Retrieved Oct. 12, 2020, Available at: http://tieba.baidu.com/p/2291232658.

*Primary Examiner* — Tuyen K Vo
(74) *Attorney, Agent, or Firm* — JCIPRNET

(57) ABSTRACT

An integrated circuit, a wireless communication card and a wiring structure of an identification mark are provided. The integrated circuit includes a power supply wiring, a ground wiring and at least one identification mark pattern. Each identification mark pattern has a first conductive wiring and a second conductive wiring that overlap each other, wherein the first conductive wiring is electrically connected to the power wiring, and the second conductive wiring is electrically connected to the ground wiring.

19 Claims, 8 Drawing Sheets

(51) Int. Cl.
*G06K 19/077* (2006.01)
*H05K 1/02* (2006.01)
*G06K 19/07* (2006.01)

(52) U.S. Cl.
CPC . *H05K 1/0296* (2013.01); *H05K 2201/10098* (2013.01); *H05K 2201/10159* (2013.01)

(58) Field of Classification Search
CPC ........... G06K 19/07707; H05K 1/0296; H05K 1/028; H05K 2201/10159; H05K 2201/10098; H05K 2201/09936; H05K 1/0266; H01L 23/49838; H01L 23/49855; H01L 23/4985; H01L 23/544; H01L 2223/54406
USPC .................................. 235/383, 385, 451, 492
See application file for complete search history.

(56) References Cited

U.S. PATENT DOCUMENTS

| | | | | |
|---|---|---|---|---|
| 2012/0218723 | A1* | 8/2012 | Kwak | H01Q 7/00 |
| | | | | 361/748 |
| 2016/0352148 | A1* | 12/2016 | Ichikawa | G01L 3/101 |
| 2019/0199001 | A1* | 6/2019 | Kato | H01Q 1/24 |
| 2021/0242121 | A1* | 8/2021 | Park | H01L 23/50 |

* cited by examiner

INTEGRATED CIRCUIT, WIRELESS COMMUNICATION CARD AND WIRING STRUCTURE OF IDENTIFICATION MARK

CROSS-REFERENCE TO RELATED APPLICATION

This application claims the priority benefits of U.S. provisional application No. 62/947,190, filed on Dec. 12, 2019, and Taiwan application no. 109133465, filed on Sep. 26, 2020. The entirety of each of the above-mentioned patent applications is hereby incorporated by reference herein.

BACKGROUND

Field of the Disclosure

The disclosure relates to a circuit layout, and particularly relates to an integrated circuit, a wireless communication card and a wiring structure of an identification mark.

Description of Related Art

Wireless communication cards, such as near-field wireless communication (NFC) cards and radio frequency identification (RFID) cards, have the advantage that they can be directly sensed by the sensor without being taken out of the wallet. Since wireless communication cards are more convenient in use than touch-type cards, they become a common interface for transaction. Since the wireless communication card communicates through radio frequency signals, the power supply for the wireless communication card is easily affected by high-frequency noise. In order to filter high frequency noise, the higher the capacitance value of the voltage stabilizing capacitor arranged between the power supply terminal and the ground terminal, the better the effect. Therefore, how to increase the capacitance value of the voltage stabilizing capacitor in the limited card layout area has become an important issue.

SUMMARY OF THE DISCLOSURE

The disclosure provides an integrated circuit, a wireless communication card, and a wiring structure of an identification mark, which can increase the capacitance value between power supply wiring and ground wiring.

The integrated circuit of the disclosure includes a power supply wiring, a ground wiring and at least one identification mark pattern. Each identification mark pattern has a first conductive wiring and a second conductive wiring that overlap each other, wherein the first conductive wiring is electrically connected to the power wiring, and the second conductive wiring is electrically connected to the ground wiring.

The wireless communication card of the disclosure includes the above-mentioned integrated circuit and an antenna electrically connected to the integrated circuit.

The identification mark wiring structure of the disclosure includes a first wiring, a second wiring and at least one identification mark pattern. Each identification mark pattern has a first conductive wiring and a second conductive wiring overlapping each other, wherein the first conductive wiring is electrically connected to the first wiring, and the second conductive wiring is electrically connected to the second wiring.

Based on the above, in the integrated circuit, wireless communication card, and wiring structure of identification mark described in the embodiment of the disclosure, the identification mark pattern in the integrated circuit is made into a structure with dual conductive layer to form a capacitor between power supply wiring and ground wiring, thereby increasing the capacitance value between the power supply wiring and the ground wiring.

In order to make the aforementioned features and advantages of the disclosure more comprehensible, embodiments accompanying figures are described in detail below.

DESCRIPTION OF EMBODIMENTS

Unless otherwise defined, all terms (including technical and scientific terms) used herein have the same meaning as commonly understood by those of ordinary skill in the art. It will be further understood that terms such as those defined in commonly used dictionaries should be interpreted as having meanings consistent with their meanings in the context of related technologies and the present disclosure, and will not be interpreted in an idealized or excessively formal sense unless explicitly defined as such in this article.

It should be understood that although the terms "first", "second", "third", etc. may be used herein to describe various elements, components, regions, layers and/or parts, these elements, components, regions, and/or parts should not be restricted by these terms. These terms are only used to distinguish one element, component, region, layer or part from another element, component, region, layer or part. Therefore, the "first element", "first component", "first region", "first layer" or "first part" discussed below may be referred to as a second element, second component, second region, second layer or second part without departing from the teachings herein.

The terms used herein are only for the purpose of describing specific embodiments, and are not restrictive. As used herein, unless the content clearly indicates otherwise, the singular forms "a", "an" and "the" are intended to involve the plural forms, including "at least one"; "or" means "and/or". As used herein, the term "and/or" includes any and all combinations of one or more related listed items. It should also be understood that when used in this specification, the terms "including" and/or "comprising" designate the presence of the features, regions, wholes, steps, operations, elements, and/or components, but do not exclude the presence or addition of one or more other features, overall regions, steps, operations, elements, components, and/or combinations thereof.

Figure 1A:
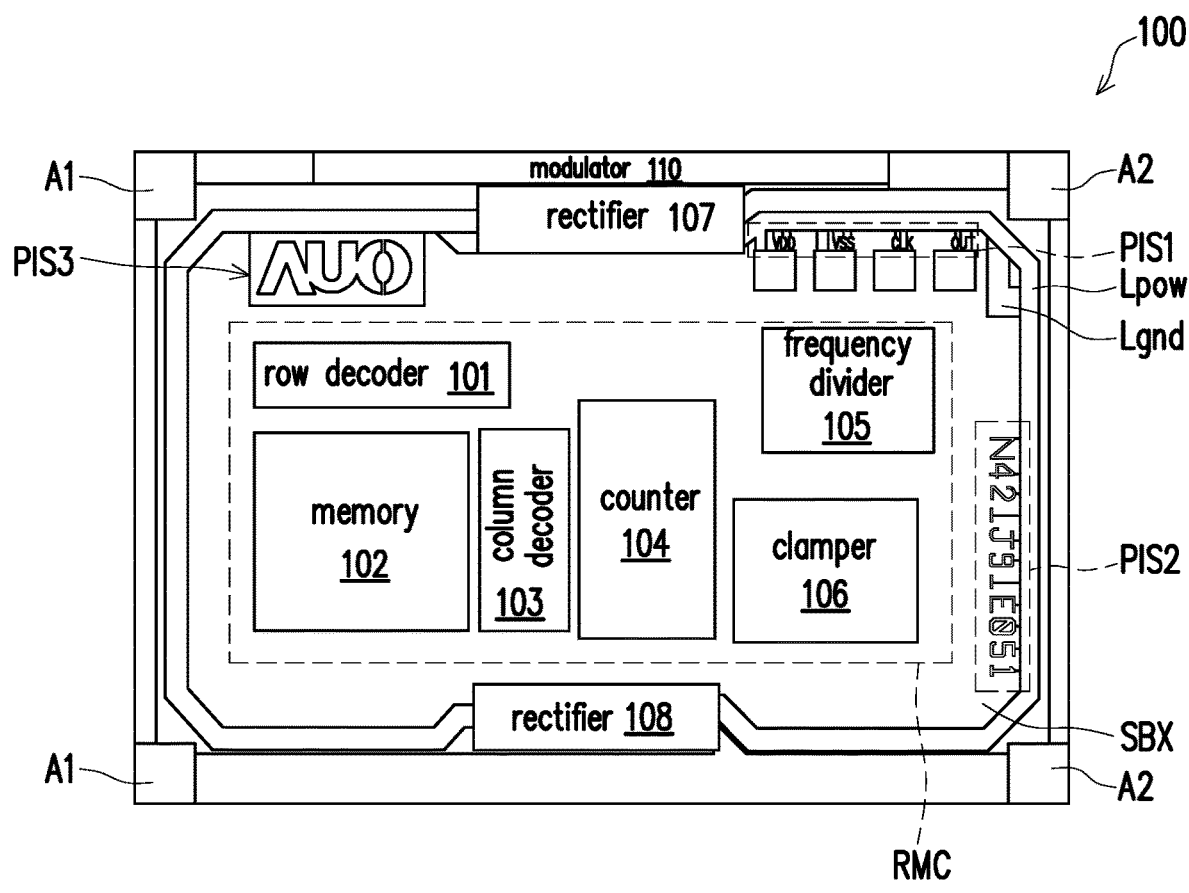
FIG. 1A is a system diagram of a wireless communication card according to an embodiment of the disclosure.

FIG. 1A is a system diagram of a wireless communication card according to an embodiment of the disclosure. Referring to FIG. 1A, in this embodiment, the wireless communication card 10 at least includes an integrated circuit 100, a modulator 110, and antenna pads A1 and A2. The wireless communication card 10 is, for example, applied to at least one of near field wireless communication (NFC) and radio frequency identification (RFID). The integrated circuit 100 at least includes a power supply wiring Lpow (corresponding to the first wiring) configured on the substrate SBX (e.g., a flexible substrate), a ground wiring Lgnd (corresponding to the second wiring), a row decoder 101, a memory 102, a column decoder 103, a counter 104, a frequency divider 105, a clamper 106, rectifiers 107 and 108, and a plurality of identification mark patterns PIS1 to PIS3.

In this embodiment, the row decoder 101, the memory 102, the column decoder 103, the counter 104, the frequency divider 105, the clamper 106, the rectifiers 107 and 108 are arranged in the main circuit region RMC, and the rectifiers 107 and 108 are configured to rectify the input received from the antenna (e.g., AT shown in FIG. 1A) to provide the system high voltage and the system low voltage. The substrate SBX is, for example, a flexible substrate, such as a plastic substrate or other polymer substrates. The material of the flexible substrate is, for example, polyimide (PI) or other flexible materials, so that the flexible electronic device with the flexible substrate can be correspondingly flexed or bent when being subjected to an external force, and can also be lighter and thinner so as to be more convenient in use when being applied to integrated circuits and wireless communication cards.

The power wiring Lpow and the ground wiring Lgnd are electrically connected to the rectifiers 107 and 108. The power wiring Lpow and the ground wiring Lgnd mostly overlap, and the power wiring Lpow and the ground wiring Lgnd are arranged along the edge of the integrated circuit 100 and encircle a main circuit region RMC. The identification mark patterns PIS1 to PIS3 are arranged between the main circuit region RMC and the power supply wiring Lpow and the ground wiring Lgnd. Different from the single metal layer of the conventional identification mark pattern, the identification mark patterns PIS1 to PIS3 in the embodiment of the disclosure are dual conductive layers (that is, with first conductive wiring and second conductive wiring) to form a dual conductive layer capacitor (for example, first conductive layer/insulating layer/second conductive layer structure).

The two overlapping conductive layers (that is, having a first conductive wiring and a second conductive wiring) of the identification mark patterns PIS1 to PIS3 are respectively electrically connected to the power supply wiring Lpow and the ground wiring Lgnd to form the capacitor between the power supply wiring Lpow and the ground wiring Lgnd, thereby increasing the capacitance value between the power supply wiring Lpow and the ground wiring Lgnd. The materials of the two conductive layers of the identification mark patterns PIS1 to PIS3 are, for example, metal, and the reflectance of the metal of the identification mark patterns PIS1 to PIS3 is more than 50%.

In the embodiment of the disclosure, the integrated circuit 100 is electrically connected to the antenna pads A1 and A2 through the modulator 110, and briefly speaking, the modulator 110 converts analog signals into digital signals.

Figure 1B:
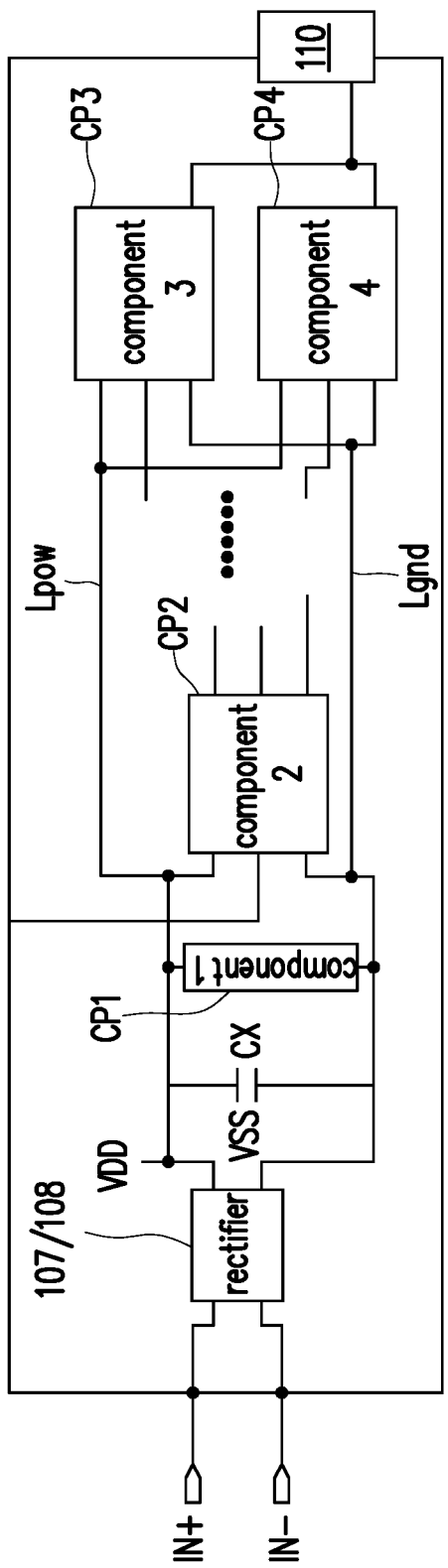
FIG. 1B is a system diagram of a wireless communication card according to an embodiment of the disclosure.
Figure 1C:
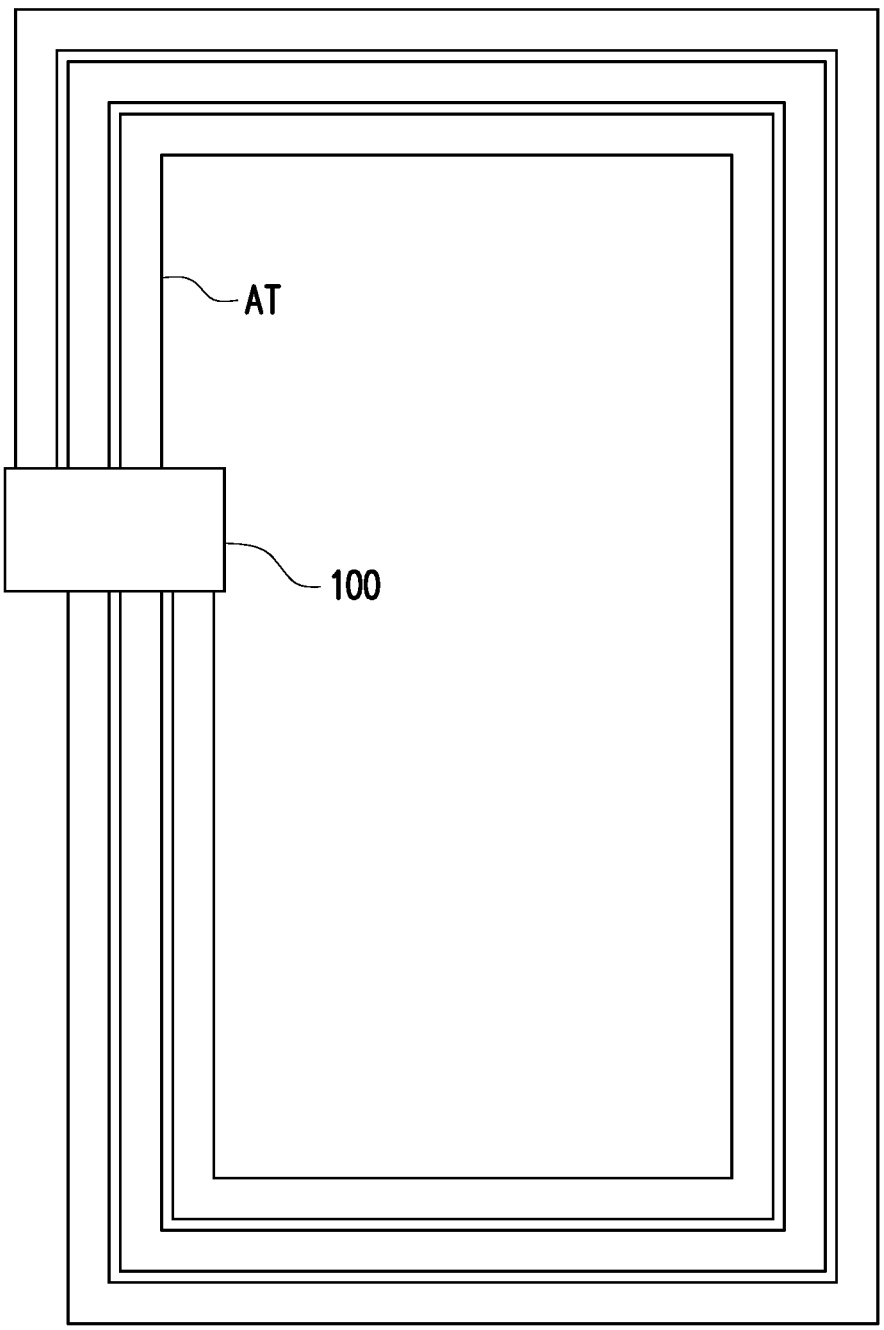
FIG. 1C is a system diagram of a wireless communication card according to an embodiment of the disclosure.

FIG. 1B is a system diagram of a wireless communication card according to an embodiment of the disclosure. FIG. 1C is a system diagram of a wireless communication card according to an embodiment of the disclosure. Please refer to FIG. 1A to FIG. 1C. In this embodiment, the rectifiers 107 and 108 rectify the inputs IN+ and IN− received from the antenna (e.g., AT shown in FIG. 1C) to provide the system high voltage VDD and the system low voltage VSS. Specifically, the system high voltage VDD is transmitted to the components (such as CP1~CP4) in the system through the power supply wiring Lpow, and the system low voltage VSS is transmitted to the components (such as CP1~CP4) in the system through the ground wiring Lgnd. Specifically, the integrated circuit 100 can be electrically connected to the antenna AT through, for example, antenna pads A1 and A2.

In addition, the voltage stabilizing capacitor CX is made from (or formed by) the identification mark patterns PIS1~PIS3 between the power supply wiring Lpow and the ground wiring Lgnd, and the components CP1~CP4 in the system are, for example, the row decoder 101, the memory 102, the column decoder 103, the counter 104, the frequency divider 105 and the clamper 106 shown in FIG. 1A.

Figure 2:
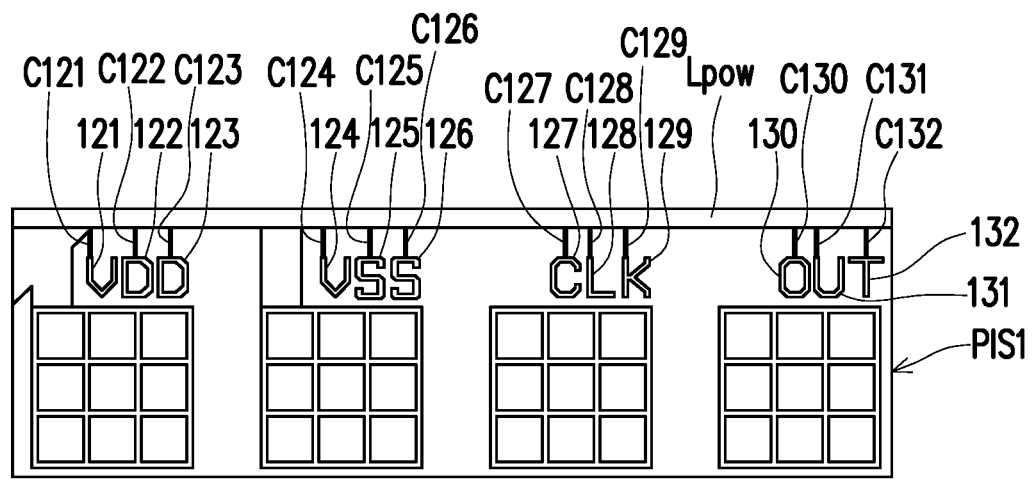
FIG. 2 is a detailed schematic diagram of an identification mark pattern PIS1 according to an embodiment of the disclosure.

FIG. 2 is a detailed schematic diagram of an identification mark pattern PIS1 according to an embodiment of the disclosure. Referring to FIG. 1A and FIG. 2, in this embodiment, the identification mark pattern PIS1 has a plurality of English character patterns 121-132, which are provided to identify the definition of the test keys below, for example, "VDD" that defines the power terminal, "VS S" that defines the low voltage terminal, "CLK" that defines the clock terminal, and "OUT" that defines the output terminal, but the embodiment of the disclosure is not limited thereto.

The two conductive layers of each of the English character patterns 121-132 are respectively electrically connected to the power supply wiring Lpow and the ground wiring Lgnd through one of the multiple pairs of traces C121-C132 to form the capacitor between the power supply wiring Lpow and the ground wiring Lgnd. Moreover, in the embodiment of the disclosure, the stroke width of the English character patterns 121-132 can be adjusted so that the wiring area of the English character patterns 121-132, that is, the equivalent capacitances of the English character patterns 121-132, will be the same. Specifically, the structure in which the two conductive layers of each of the English character patterns 121-132 are respectively electrically connected to the power supply wiring Lpow and the ground wiring Lgnd through one of the multiple pairs of traces C121-C132 can be regarded as a wiring structure of an identification mark. Furthermore, the contours of the two conductive layers of the respective English character patterns 121-132 form corresponding identification marks.

Figure 3:
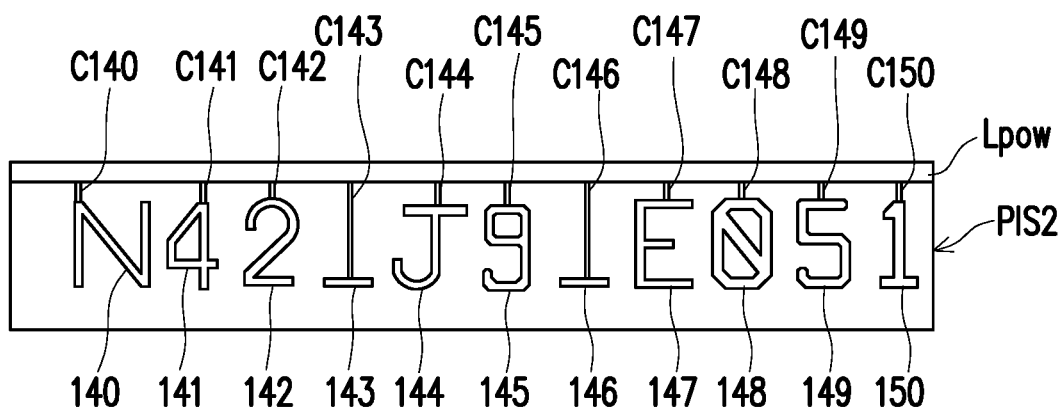
FIG. 3 is a detailed schematic diagram of an identification mark pattern PIS2 according to an embodiment of the disclosure.

FIG. 3 is a detailed schematic diagram of an identification mark pattern PIS2 according to an embodiment of the disclosure. Referring to FIG. 1A and FIG. 3, in this embodiment, the identification mark pattern PIS2 has a plurality of English character patterns 140, 144, 147, a plurality of underline character patterns 143, 146, and a plurality of digital character patterns 141, 142, 145, 148, 149, and 150, which are provided to define the identification code (or model number) of the integrated circuit 100, for example, to define "N42_J9_E051", but the embodiment of the disclosure is not limited thereto.

The two conductive layers of each of the English character patterns 140, 144, 147, the underline character patterns 143, 146, and the digital character patterns 141, 142, 145, 148, 149, 150 are respectively electrically connected to the power supply wiring Lpow and the ground wiring Lgnd through one of the multiple pairs of traces C140-C150 to form a capacitor between the power supply wiring Lpow and the ground wiring Lgnd. Moreover, in the embodiment of the disclosure, the stroke width of the English character patterns 140, 144, and 147 can be adjusted so that the wiring areas of the English character patterns 140, 144, and 147 are the same, that is, the equivalent capacitances of the English character patterns 140, 144, and 147 will be the same. The stroke width of the digital character patterns 141, 142, 145, 148, 149, 150 can be adjusted so that the wiring area of the digital character patterns 141, 142, 145, 148, 149, and 150 are the same, that is, the equivalent capacitances of the digital character patterns 141, 142, 145, 148, 149, and 150 will be the same. In an embodiment of the disclosure, the wiring area of the English character patterns 140, 144, and 147 may be the same as or different from the wiring area of the digital character patterns 141, 142, 145, 148, 149, and 150; that is, the wiring area of the English character patterns 140, 144 and 147 may be greater than, equal to, or smaller than the wiring area of the digital character patterns 141, 142, 145, 148, 149, and 150, but the embodiment of the disclosure is not limited thereto.

Specifically, the structure in which the two conductive layers of each of the English character patterns 140, 144, 147, the underline character patterns 143, 146, and the digital character patterns 141, 142, 145, 148, 149, and 150 are respectively electrically connected to the power supply wiring Lpow and the ground wiring Lgnd through one of the multiple pairs of C140-C150 can be regarded as a wiring structure of an identification mark. In addition, the contours of the two conductive layers of each of the English character patterns 140, 144, 147, the underline character patterns 143, 146, and the digital character patterns 141, 142, 145, 148, 149, and 150 form a corresponding identification mark.

Figure 4A:
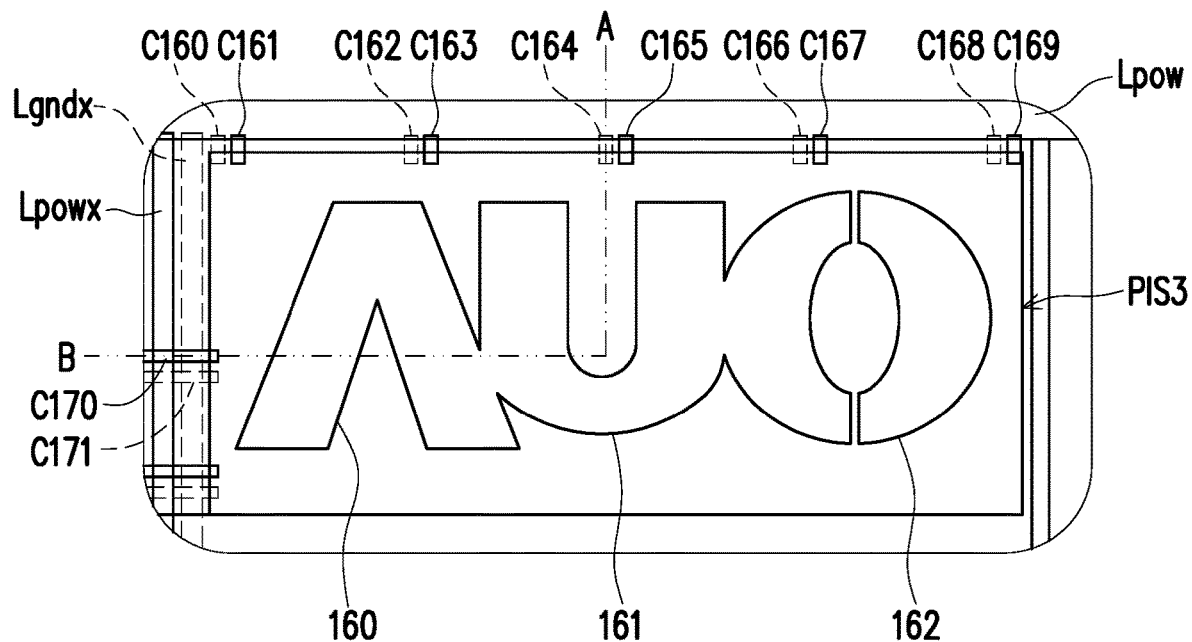
FIG. 4A is a detailed schematic diagram of an identification mark pattern PIS3 according to an embodiment of the disclosure.

FIG. 4A is a detailed schematic diagram of an identification mark pattern PIS3 according to an embodiment of the disclosure. Referring to FIG. 1A and FIG. 4A, in this embodiment, the identification mark pattern PIS3 has a plurality of English character patterns 160-162 to identify the manufacturer of the chip, such as "AUO", but the embodiment of the disclosure is not limited thereto. Specifically, the English character patterns 160-162 (i.e., the identification marks) of the identification mark pattern PIS3 are formed by the hollow parts of the two conductive layers. The identification mark pattern PIS3 is not limited to English characters, and may be other patterns, such as trademark patterns.

The two conductive layers forming the English character patterns 160-162 can be electrically connected to the power supply wiring Lpow and the ground wiring Lgnd through a plurality of traces C160-C169 to form a capacitor between the power supply wiring Lpow and the ground wiring Lgnd. However, in the embodiment of the disclosure, the two conductive layers forming the English character patterns 160-162 can be directly electrically connected to the power supply wiring Lpow and the ground wiring Lgnd without the configuration of the traces C160-C169. Specifically, the structure in which the two conductive layers forming the English character patterns 160-162 are directly/indirectly electrically connected to the power supply wiring Lpow and the ground wiring Lgnd can be regarded as a wiring structure of an identification mark.

In addition, the integrated circuit 100 further includes extension wirings Lpowx and Lgndx that are electrically connected to the power supply wiring Lpow and the ground wiring Lgnd, and the two conductive layers forming the English character patterns 160-162 can be further electrically connected to the extension wirings Lpowx and Lgndx through the traces C170-C171. Specifically, the ratio (that is, the transmittance rate) of the hollow area to the non-hollow area of the identification mark pattern PIS3 may be T %, wherein 90%>T %>10%.

Figure 4B:
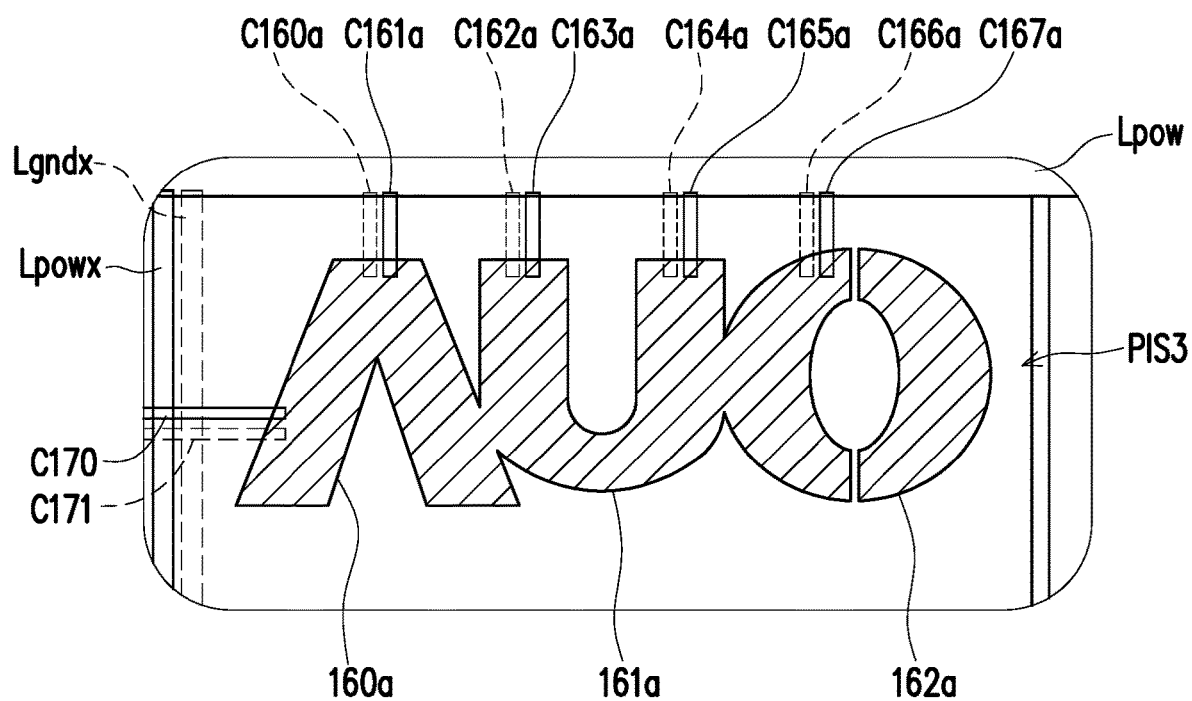
FIG. 4B is a detailed schematic diagram of an identification mark pattern PIS3 according to an embodiment of the disclosure.

FIG. 4B is a detailed schematic diagram of an identification mark pattern PIS3 according to an embodiment of the disclosure. Referring to FIG. 4A and FIG. 4B, in this embodiment, the English character patterns 160a-162a of the identification mark pattern PIS3 are formed by the contour of the conductive layer, and are electrically connected to the power supply wiring Lpow and the ground wiring Lgnd through the traces C160a-C167a, wherein the same or similar components are denoted by the same or similar reference numerals.

Figure 5:
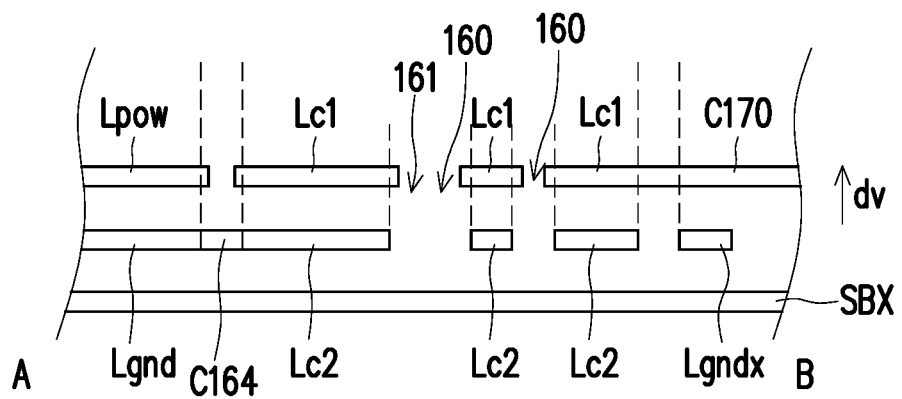
FIG. 5 is a first cross-sectional schematic diagram of the line segment A-B of the identification mark pattern PIS3 according to an embodiment of the disclosure.

FIG. 5 is a first cross-sectional schematic diagram of the line segment A-B of the identification mark pattern PIS3 according to an embodiment of the disclosure. Referring to FIG. 5, in this embodiment, in the line segment A-B of the identification mark pattern PIS3, the edge of the first conductive wiring Lc1 and the edge of the second conductive wiring Lc2 of the identification mark pattern PIS1 are not aligned in the overlapping direction dv. Furthermore, in the overlapping direction dv, in the identification mark pattern PIS1, the edge of the first conductive wiring Lc1 extends beyond the edge of the second conductive wiring Lc2, wherein the difference between the edge of the first conductive wiring Lc1 and the edge of the second conductive wiring Lc2 can be 1 to 3 microns (um).

Figure 6:
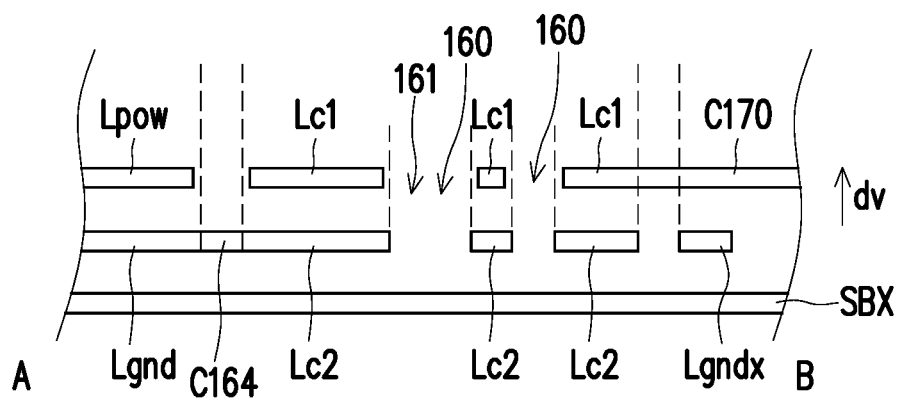
FIG. 6 is a second cross-sectional schematic diagram of the line segment A-B of the identification mark pattern PIS3 according to an embodiment of the disclosure.

FIG. 6 is a second cross-sectional schematic diagram of the line segment A-B of the identification mark pattern PIS3 according to an embodiment of the disclosure. Referring to FIG. 6, in this embodiment, in the line segment A-B of the identification mark pattern PIS3, the edge of the first conductive wiring Lc1 and the edge of the second conductive wiring Lc2 of the identification mark pattern PIS1 are not aligned in the overlapping direction dv. Further, in the overlapping direction dv, in the identification mark pattern PIS1, the edge of the second conductive wiring Lc2 extends beyond the edge of the first conductive wiring Lc1, wherein the difference between the edge of the first conductive wiring Lc1 and the edge of the second conductive wiring Lc2 can be 1 to 3 microns (um).

Figure 7:
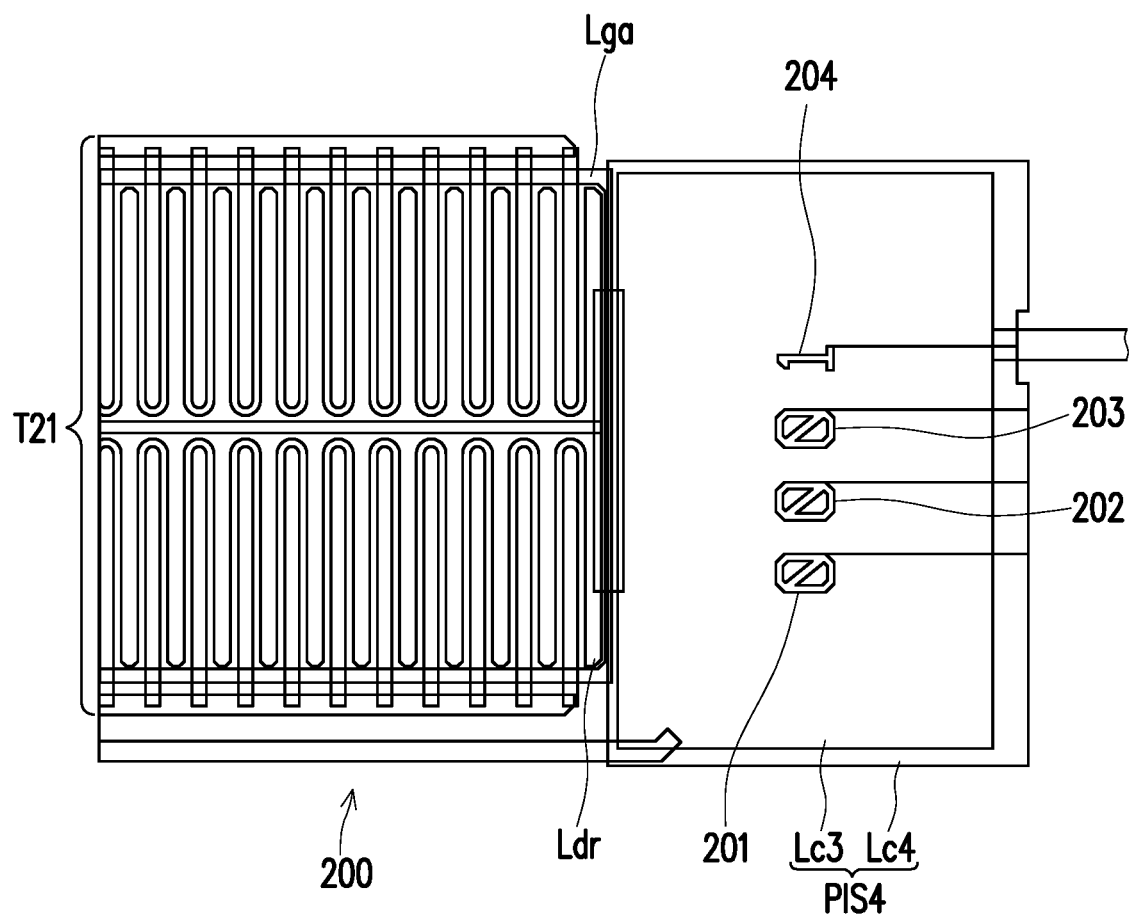
FIG. 7 is a system diagram of a wiring structure of an identification mark according to another embodiment of the disclosure.

FIG. 7 is a system diagram of a wiring structure of an identification mark according to another embodiment of the disclosure. Referring to FIG. 7, in this embodiment, the identification mark wiring structure 200 includes a transistor T21, a first conductive wiring Lc3, and a second conductive wiring Lc4, wherein the first conductive wiring Lc3 is electrically connected to the drain wiring Ldr (corresponding to the first conductive wiring) of the transistor T21, and the second conductive wiring Lc4 is electrically connected to the gate wiring Lga (corresponding to the second conductive wiring) of the transistor T21. Moreover, the first conductive wiring Lc3 and the second conductive wiring Lc4 overlap each other, and the hollow portions of the first conductive wiring Lc3 and the second conductive wiring Lc4 form corresponding identification marks (for example, "0001"). In this manner, the distance between the first conductive wiring Lc3 and the second conductive wiring Lc4 and other wirings can be reduced, so as to reduce the overall circuit area of the integrated circuit, and the circuit area for forming the identification mark can be decreased as well. In the embodiment of the disclosure, the identification mark wiring structure 200 can be applied to any semiconductor product, for example, applied to a gate driver on array (GOA).

Figure 8:
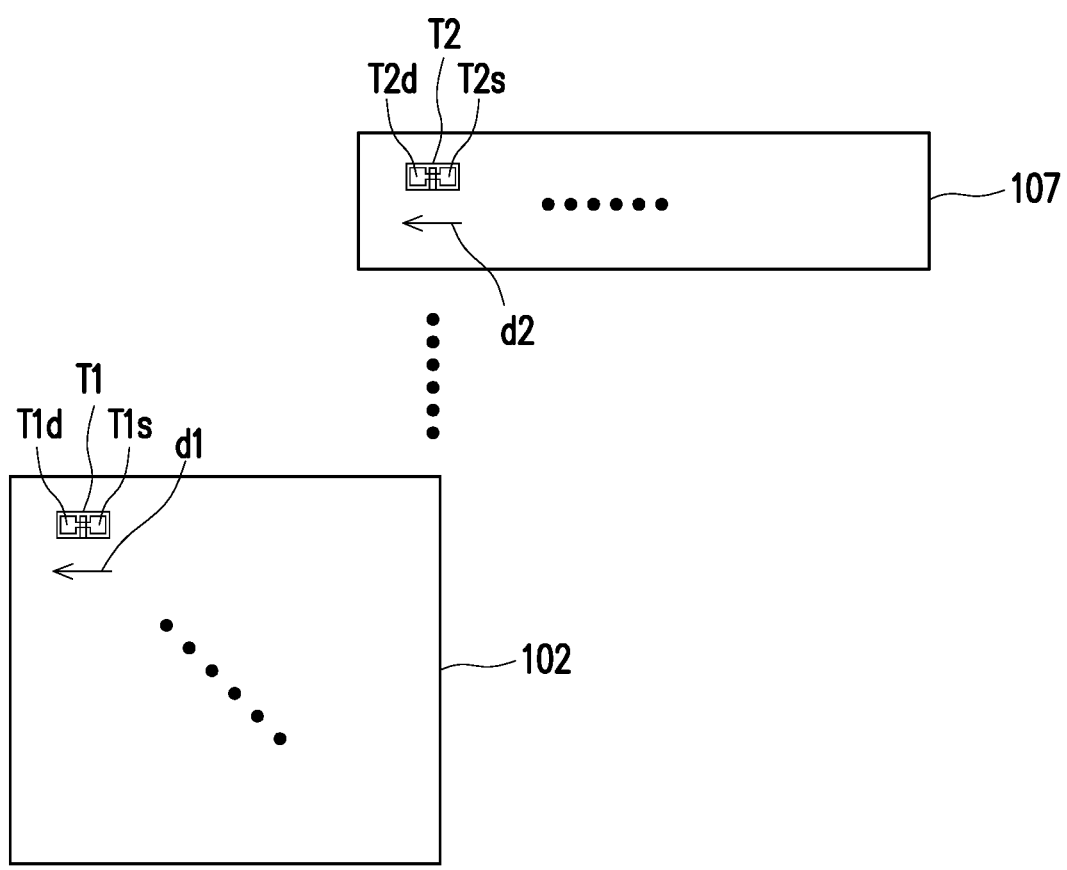
FIG. 8 is a schematic diagram showing the configuration of a memory and a transistor of a rectifier according to an embodiment of the disclosure.

FIG. 8 is a schematic diagram showing the configuration of a memory and a transistor of a rectifier according to an embodiment of the disclosure. Referring to FIG. 1A and FIG. 8, in this embodiment, the memory 102 has a plurality of transistors T1, the plurality of first channel directions d1, which are from the source T1s to the drain T1d, in the plurality of transistors T1 of the memory 102 are the same. Furthermore, the rectifier 107 has a plurality of transistors T2, and the plurality of second channel directions d2, which are from the source T2s to the drain T2d, in the plurality of transistors T2 of the rectifier 107 are the same. Moreover, the first channel directions d1, which are from the source to the drain, in the transistors T1 of the memory 102 are the same as the second channel directions d2, which are from the source to the drain, in the transistors T1 of the rectifier 107, but the embodiment of the disclosure is not limited thereto. In the embodiment of the disclosure, the channel directions, which are the source to the drain, in the transistors in the row decoder 101, the memory 102, the column decoder 103, the counter 104, the frequency divider 105, the clamper 106, and the rectifiers 107 and 108 of the integrated circuit 100 may be the same, so that the electrical properties of the components in the integrated circuit 100 are uniform.

In summary, in the integrated circuit, wireless communication card, and wiring structure of identification mark described in the embodiment of the disclosure, the identification mark pattern in the integrated circuit is made into a structure with dual conductive layer to form a capacitor between power supply wiring and ground wiring, thereby increasing the capacitance value between the power supply wiring and the ground wiring.

Although the present disclosure has been described in detail with reference to the foregoing embodiments, those of ordinary skill in the art should understand that it is still possible to modify the technical solutions described in the foregoing embodiments, or equivalently replace some or all of the technical features; these modifications or replacements do not make the nature of the corresponding technical solutions deviate from the scope of the technical solutions in the embodiments of the present disclosure.

What is claimed is:

1. An integrated circuit, comprising:
    a power supply wiring;
    a ground wiring;
    at least one identification mark pattern respectively having a first conductive wiring and a second conductive wiring overlapping each other, wherein the first conductive wiring is electrically connected to the power supply wiring, and the second conductive wiring is electrically connected to the ground wiring,
    wherein a transmittance rate of the at least one identification mark pattern is 90%>T %>10%.

2. The integrated circuit according to claim 1, wherein the at least one identification mark pattern comprises a plurality of character patterns, and wiring areas of the character patterns are the same as each other.

3. The integrated circuit according to claim 1, wherein the at least one identification mark patterns are arranged on a flexible substrate.

4. The integrated circuit according to claim 1, wherein contours of the first conductive wiring and the second conductive wiring of each of the identification mark patterns form corresponding identification marks.

5. The integrated circuit according to claim 1, wherein hollow portions of the first conductive wiring and the second conductive wiring of each of the identification mark patterns form corresponding identification marks.

6. The integrated circuit according to claim 1, wherein an edge of the first conductive wiring and an edge of the second conductive wiring of each of the identification mark patterns are not aligned in an overlapping direction.

7. The integrated circuit according to claim 1, wherein materials of the first conductive wiring and the second conductive wiring are metal.

8. The integrated circuit according to claim 1, wherein the power supply wiring and the ground wiring overlap each other.

9. The integrated circuit according to claim 8, wherein the power supply wiring and the ground wiring are arranged along an edge of the integrated circuit and encircles a main circuit region.

10. The integrated circuit according to claim 9, wherein the at least one identification mark pattern is arranged between the main circuit region and the power supply wiring and the ground wiring.

11. The integrated circuit according to claim 9, wherein the main circuit region is provided with a memory, and a plurality of first channel directions, which are from a source to a drain, in a plurality of transistors of the memory are the same.

12. The integrated circuit according to claim 11, wherein the power supply wiring and the ground wiring are electrically connected to at least one rectifier, and the first channel directions, which are from the source to the drain, in the transistors of the memory are the same as a plurality of second channel directions, which are from the source to the drain, in a plurality of transistors of the at least one rectifier.

13. A wireless communication card, further comprising:
    an integrated circuit as claimed in claim 1;
    an antenna electrically connected to the integrated circuit.

14. A wiring structure of an identification mark, comprising:
    a first wiring;
    a second wiring;
    at least one identification mark pattern respectively having a first conductive wiring and a second conductive wiring overlapping each other, wherein the first conductive wiring is electrically connected to the first wiring, and the second conductive wiring is electrically connected to the second wiring,
    wherein a transmittance rate of the at least one identification mark pattern is 90%>T %>10%.

15. The wiring structure of the identification mark according to claim 14, wherein the first wiring is a power supply wiring, and the second wiring is a ground wiring.

16. The wiring structure of the identification mark according to claim 15, wherein contours of the first conductive wiring and the second conductive wiring of each of the at least one identification mark pattern form corresponding identification marks.

17. The wiring structure of the identification mark according to claim 15, wherein hollow portions of the first conductive wiring and the second conductive wiring respectively for the at least one identification mark pattern form corresponding identification marks.

18. The wiring structure of the identification mark according to claim 14, wherein the first wiring is a drain wiring, and the second wiring is a source wiring.

19. The wiring structure of the identification mark according to claim 18, wherein hollow portions of the first conductive wiring and the second conductive wiring respectively for the at least one identification mark pattern form corresponding identification marks.

* * * * *